(12) United States Patent
Schrom et al.

(10) Patent No.: US 9,252,775 B2
(45) Date of Patent: Feb. 2, 2016

(54) HIGH-VOLTAGE LEVEL-SHIFTER

(75) Inventors: Gerhard Schrom, Hillsboro, OR (US);
Ravi Sankar Vunnam, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/995,098

(22) PCT Filed: Dec. 22, 2011

(86) PCT No.: PCT/US2011/066794
§ 371 (c)(1),
(2), (4) Date: Jun. 17, 2013

(87) PCT Pub. No.: WO2013/095500
PCT Pub. Date: Jun. 27, 2013

(65) Prior Publication Data
US 2014/0210517 A1    Jul. 31, 2014

(51) Int. Cl.
*H03K 19/0175* (2006.01)
*H03K 19/0185* (2006.01)
*H03K 19/003* (2006.01)

(52) U.S. Cl.
CPC .. *H03K 19/017509* (2013.01); *H03K 19/00315* (2013.01); *H03K 19/0185* (2013.01); *H03K 19/018514* (2013.01); *H03K 19/018521* (2013.01); *H03K 19/018528* (2013.01)

(58) Field of Classification Search
CPC ............... H03K 19/018521; H03K 19/00315; H03K 19/018528; H03K 19/018585; H03K 3/356113
USPC .................................. 326/80, 62, 63; 327/333
See application file for complete search history.

(56) References Cited

U.S. PATENT DOCUMENTS

| | | | |
|---|---|---|---|
| 5,680,064 A | 10/1997 | Masaki et al. | |
| 5,811,857 A | 9/1998 | Assaderaghi et al. | |
| 5,883,538 A * | 3/1999 | Keeth ....................... | G11C 8/08 326/81 |
| 5,969,542 A * | 10/1999 | Maley et al. .................... | 326/81 |

(Continued)

FOREIGN PATENT DOCUMENTS

JP       2009-182609       8/2009

OTHER PUBLICATIONS

International Search Report and Written Opinion for International Patent Application No. PCT/US2011/066794, mailed on Sep. 27, 2012, 10 pages.

(Continued)

*Primary Examiner* — Dylan White
(74) *Attorney, Agent, or Firm* — Blakely, Sokoloff, Taylor & Zafman LLP

(57) ABSTRACT

Described herein is a high-voltage level-shifter (HVLS) that can be used for both NMOS and PMOS bridges, exhibits a higher voltage tolerance for over-clocking than traditional level-shifters, has reduced crowbar current in its input driver, and no contention in its output driver. The HVLS comprises an input driver including a first signal conditioning unit, the input driver operating on a first power supply level and for conditioning an input signal as a first signal in the first signal conditioning unit; and a circuit to receive the first signal and to provide a second signal based at least in part on the first signal, the second signal being level-shifted from the first power supply level to a second power supply level, wherein the second power supply level is higher than the first power supply level.

21 Claims, 7 Drawing Sheets

(56) References Cited

U.S. PATENT DOCUMENTS

| | | | | |
|---|---|---|---|---|
| 6,487,687 | B1* | 11/2002 | Blake et al. | 714/724 |
| 6,801,053 | B2* | 10/2004 | Sun | 326/68 |
| 7,053,657 | B1* | 5/2006 | Peng | 326/68 |
| 7,199,617 | B1 | 4/2007 | Schrom et al. | |
| 7,245,153 | B2 | 7/2007 | Murakami | |
| 7,268,588 | B2 | 9/2007 | Sanchez et al. | |
| 7,446,564 | B2* | 11/2008 | Huang | 326/68 |
| 8,013,655 | B2* | 9/2011 | Herzer et al. | 327/333 |
| 8,536,925 | B2* | 9/2013 | Bhattacharya et al. | 327/333 |
| 2010/0164593 | A1 | 7/2010 | Ha et al. | |

OTHER PUBLICATIONS

First Notification for Rectification issued for Chinese Utility Model Patent Application No. 201220716504.X, mailed Apr. 12, 2013.
Second Notification for Rectification issued for Chinese Utility Model Patent Application No. 201220716504.X, mailed Jul. 18, 2013, 2 pages.
Taiwan Patent Application No. 101144775, Office Action and Taiwan IPO Search Report (with English translation), dated Dec. 22, 2014, (14 pages).
International Preliminary Report on Patentability for International Application No. PCT/US2011/066794, mailed Jul. 3, 2014, 7 pages.

* cited by examiner

| Usage Mode | First Power Supply | Second Power Supply | Third Power Supply | Fourth Power Supply |
|---|---|---|---|---|
| High Voltage Application | Supply of digital input signal "in" | Logic-HIGH level of output signals out and outb | Logic-LOW level of output signals out and outb | (Second Power Supply Level)/2 |
| Low Voltage Application | Supply of digital input signal "in" | Logic-HIGH level of output signals out and outb | 0, i.e. ground | Same as Second Power Supply Level |

HIGH-VOLTAGE LEVEL-SHIFTER

CLAIM OF PRIORITY

This application claims the benefit of priority of International Patent Application No. PCT/US2011/066794 filed Dec. 22, 2011, titled "HIGH-VOLTAGE LEVEL-SHIFTER," which is incorporated by reference in its entirety.

FIELD OF THE INVENTION

Embodiments of the invention relate generally to the field of level-shifters. More particularly, embodiments of the invention relate to an apparatus for high-voltage level-shifting an input signal, a system for applying the apparatus, and a method for high-voltage level-shifting.

BACKGROUND

Level shifter circuits may enable different circuit components to operate at different power supply voltages. Operating in different logic voltage ranges serves to increase device reliability, decrease power consumption, and lower excess heat generation by providing specific voltage ranges to specific circuit components. By limiting specific components to specific operating voltages, power consumption and heat generation may be easier to control and device reliability may be increased. Utilizing different logic voltages also presents significant problems as a digital high or low for one digital logic component may not have the same voltage values for another digital logic component. Therefore, it may be difficult or even impossible for components with different voltages to operate together. Level shifter circuits may serve as interfaces (or voltage translators or converters) between different logic device components to shift the voltage level of one component to an appropriate level of a second component to ensure adequate coherence between the voltage levels of the two components.

Traditional high-voltage level-shifters suffer from high power consumption due to crowbar currents when they translate a digital logic signal from one power supply level to another power supply level. Traditional high-voltage level-shifters are also incapable of level-shifting from one power supply level to one or more power supply levels such that power supplies are decoupled from one another.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 3 is a table showing various operating modes of the high-voltage level-shifter, according to one embodiment of the invention.

DETAILED DESCRIPTION

Embodiments of the invention relate to an apparatus for high-voltage level-shifting an input signal, a system for applying the apparatus, and a method for high-voltage level-shifting. The technical effects of the embodiments discussed herein are many and include a robust level-shifter design that can be used for both NMOS and PMOS bridges. The high-voltage level-shifter (HVLS) discussed herein exhibits a higher voltage tolerance for over-clocking than traditional level-shifters, has reduced crowbar current in its input driver, and no contention in its output driver. The HVLS discussed herein also has the digital input power supply decoupled from the other multiple power supplies of the HVLS.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Figure 1:
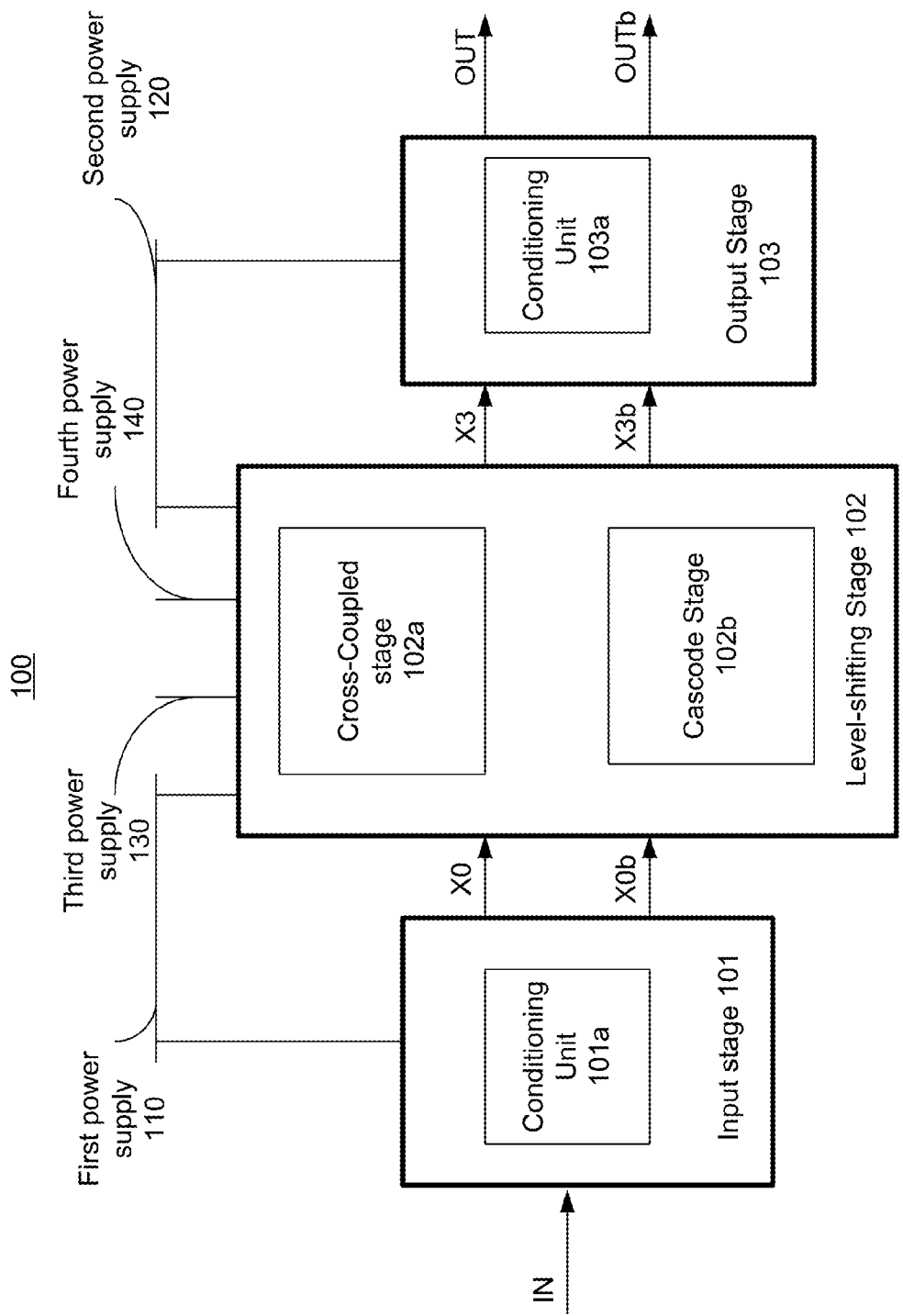
FIG. 1 is a block level architecture of a high-voltage level-shifter, according to one embodiment of the invention.

FIG. 1 is a block level architecture of a HVLS 100, according to one embodiment of the invention. In one embodiment, the HVLS 100 comprises an input stage 101 including a first signal conditioning unit 101a for storing and conditioning an input signal IN as a first signal in the first signal conditioning unit 101a. The term "conditioning" herein generally refers to stabilizing a signal to reduce contention in cross-coupled transistors and/or for storing the signal and/or for converting a signal from a differential signal to a single-ended signal.

In this embodiment, the input driver 101 operates on a first power supply level 110. The first signal conditioning unit 101a reduces crowbar current in the input stage, according to one embodiment of the invention. In one embodiment, the output of the input stage 101 is a differential output X0 and X0b. In one embodiment, the logic state in the cross-coupled PMOS pair of the level-shifting stage 102, discussed herein, is changed by pulling one of the X0 or X0b nodes to ground. In one embodiment, the first signal conditioning unit 101a reduces contention in the cross-coupled PMOS pair of the level-shifting stage 102 by raising both voltages, X0 and X0b, for a short period of time during a transition. In one embodiment, the input stage 101 generates a single-ended output which is received by the level-shifting stage 102, wherein the capacitors in the level-shifting stage 102 act as booster capacitors (C1 and C2) to compensate for any contention in the cross-coupled PMOS pair of the level-shifting stage 102.

In one embodiment, the HVLS 100 comprises a circuit 102 for level-shifting, also referred herein as the level-shifting stage, which is coupled to the input stage 101 and is operable to receive the first signal (X0 and X0b) and to provide a second signal (X3 and X3b) based at least in part on the first signal (X0 and X0b), the second signal (X3 and X3b) being level-shifted from the first power supply level 110 to a second power supply level 120, wherein the second power supply level 120 is higher than the first power supply level 110. In one embodiment, the second signal is a differential signal X3 and X3b. In other embodiments, the second signal is a single-ended signal.

Figure 2A:
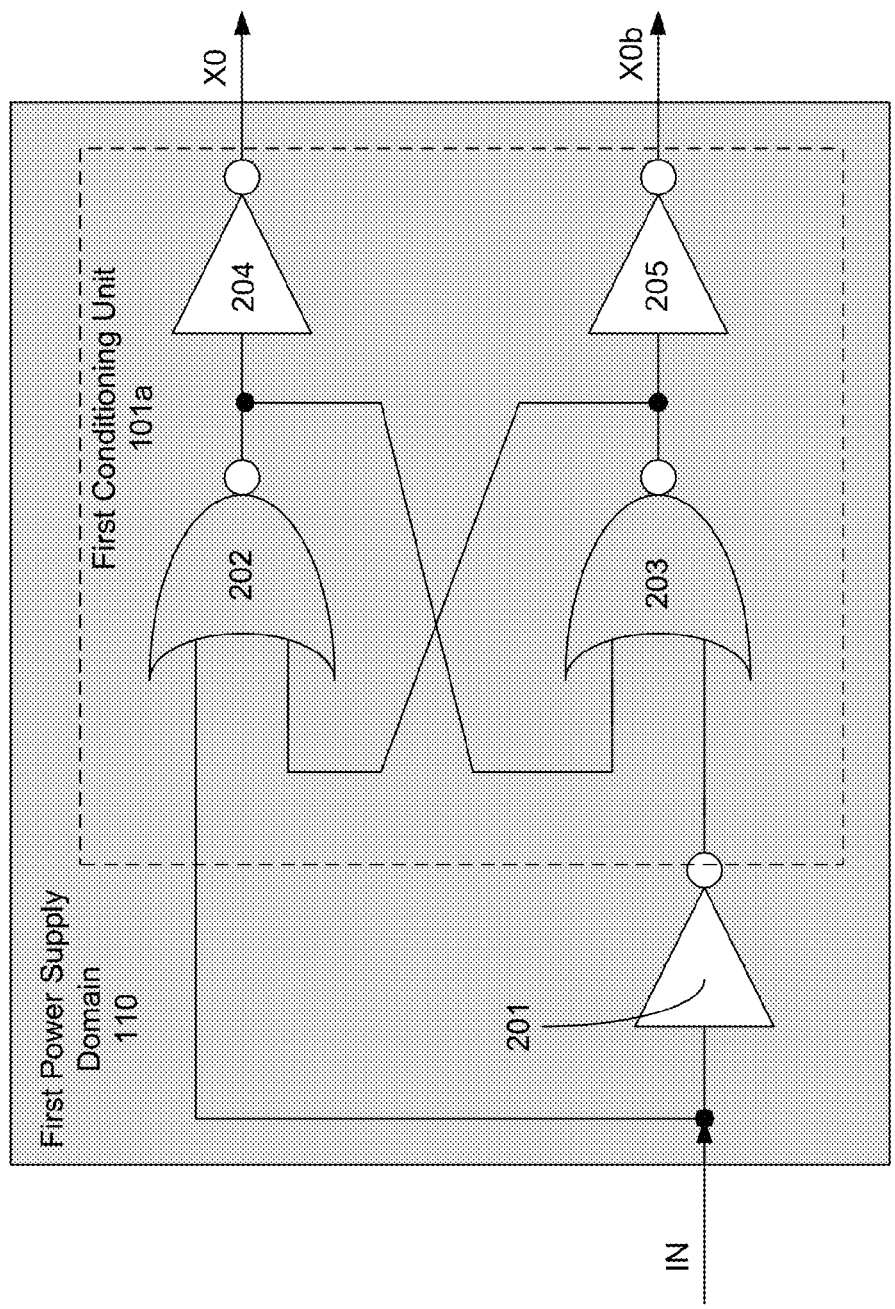
FIG. 2A is a schematic view of an input driver of the high-voltage level-shifter, according to one embodiment of the invention.
Figure 2B:
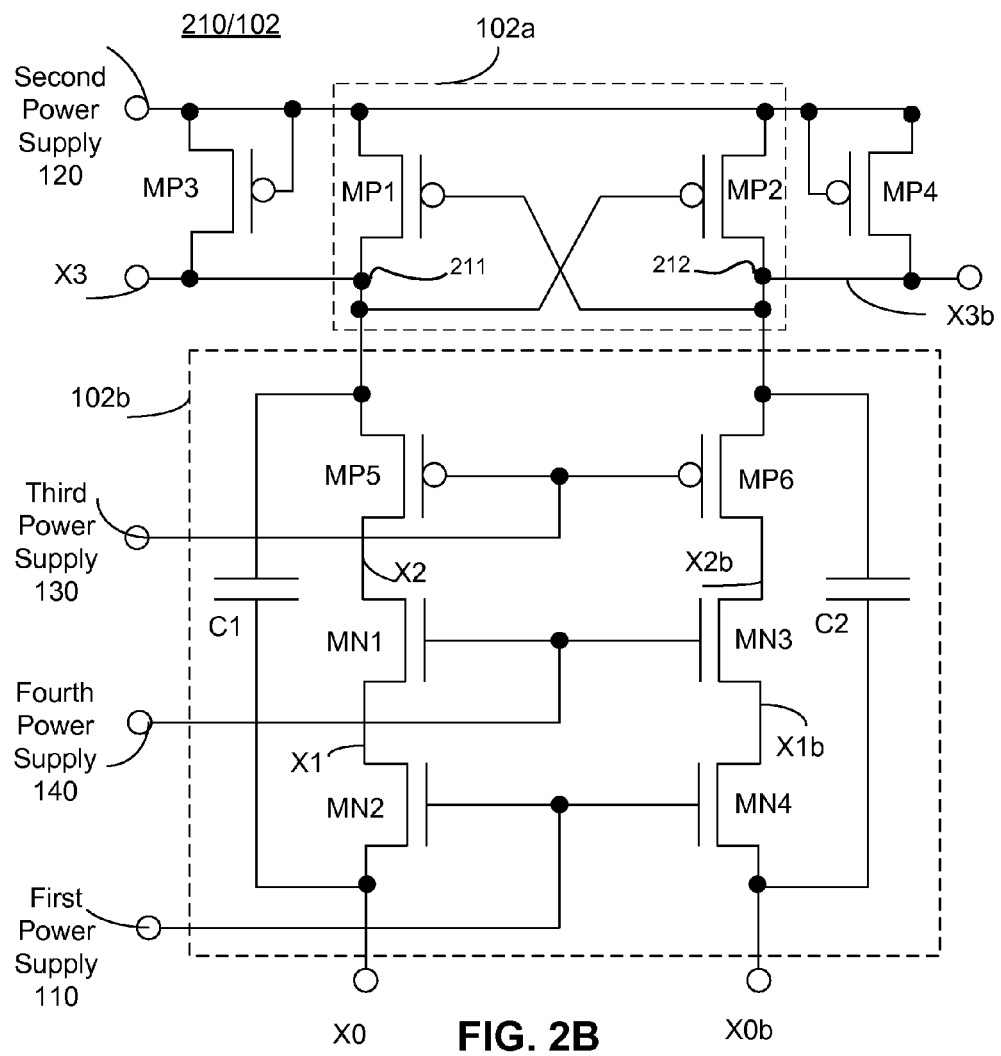
FIG. 2B is a schematic view of the level-shifting stage of the high-voltage level-shifter, according to one embodiment of the invention.

In the embodiments discussed herein the level-shifting stage 102 comprises a cross-coupled stage 102a coupled to a cascode stage 102b which are discussed herein with reference to FIG. 2B. Referring back to FIG. 1, the level-shifting stage 102 is operable to receive the first power supply level 110, the second power supply level 120, a third power supply level 130, and a fourth power supply level 140. In the embodiments discussed herein, the terms "power supply" and "power supply level" are used interchangeably.

In one embodiment, the first power supply level 110, the second power supply level 120, a third power supply level 130, and a fourth power supply level 140 are all of different power supply levels. In one embodiment, the first power supply 110 is 1V, the second power supply 120 is 0.9V to 2.0V, the third power supply 130 is –0.1V to 0.9V, and the fourth power supply 140 is 0.9 to 1.0V. In other embodiments, other ranges of voltage levels may be used for the power supplies 110, 120, 130, and 140.

In one embodiment, the first signal (X0 and X0b) operates on the first power supply 110. The terms "signal operating on a power supply" or "having the power supply" generally refers to the signal having a logical high or logical low level which corresponds to the power supply it is operating on. For example, the first signal operating on the first power supply 110 of 1V means that the first signal has a logical high level equal to 1V.

In one embodiment, the HVLS 100 further comprises an output driver 103 including a second signal conditioning unit 103a, the output driver 103 to receive the second signal (X3 and X3b) and for storing and/or conditioning the second signal (X3 and X3b) as a third signal (OUT and OUTb), the output driver operating on the second power supply level and for driving out the third signal (OUT and OUTb). In one embodiment, the first, third, and fourth power supplies are decoupled from the second power supply.

The input stage 101, the level-shifting stage 102, and the output stage 103 include one or more transistors. For purposes of this application, the transistors described in this application may be metal oxide semiconductor (MOS) transistors, which include drain, source, and gate terminals. However, those skilled in the art will appreciate that other transistors may be used without departing from the scope of the invention.

FIG. 2A is a schematic view of an input driver (stage) 200/101 of the HVLS 100, according to one embodiment of the invention. FIG. 2A is described with reference to FIG. 1. In one embodiment, the first signal conditioning unit 101a comprises an RS latch including a pair of cross-coupled NOR logic gates 202 and 203 and inverting buffer stages 204 and 205, where 'S' and 'R' of the RS latch stand for set and reset. The cross-coupled NOR logic gates receive the input signal IN and its inverted version, inverted by inverter 201, and output signals from alternating NOR gates, i.e. output of NOR gate 202 is input to NOR gate 203 and output of NOR gate 203 is input to NOR gate 202. In other embodiments, other forms of latches may be used without changing the scope of the embodiments of the invention. In one embodiment, the first signal conditioning unit 101a generates a differential signal X0 and X0b which operates on the first power supply 110. The first signal conditioning unit 101a also reduces crowbar current in the input stage because all transistors are either fully turned on or off. The outputs X0 and X0b have rail-to-rail voltage swings.

In one embodiment, the input stage 200/101 allows for a make or break operation in the level-shifting stage 102, i.e. the input stage 200/101 helps eliminate the contention between the transistors in the cross-coupled stage 102a (see FIG. 1) of the level-shifting stage 102. By eliminating the contention, the overall propagation delay and power dissipation of the HVLS are reduced.

FIG. 2B is a schematic view of the level-shifting stage 210/102 of the HVLS 100, according to one embodiment of the invention. In one embodiment, the cross-coupled stage comprises a first p-type MOS transistor MP1 cross-coupled to a second p-type MOS transistor MP2. In this embodiment, the gate MP1 is coupled to the drain terminal 212 of MP2 while the gate terminal of MP2 is coupled to the drain terminal 211 of MP1, where the drain terminals of MP1 and MP2 form the differential output X3 and X3b. In this embodiment, the source terminals of MP1 and MP2 couple to the second power supply 120.

In one embodiment, the level-shifting stage 210/102 comprises a p-type MOS transistor MP3 which is positioned in parallel to MP1 such that the gate terminal of MP3 couples to the second power supply 120. In one embodiment, a p-type MOS transistor MP4 is positioned in parallel to MP2 such that the gate terminal of MP4 couples to the second power supply 120. In one embodiment, MP3 and MP4 can be removed and replaced with current sources. In one embodiment, MP3 and MP4 can be removed. In one embodiment, MP3 and MP4 provide leakage current into nodes X3 and X3b to prevent voltages on those nodes from dropping below the negative output supply (gate voltage of the PMOS cascode devices). The sizing (W/L) of the transistors MP3 and MP4 can be used to overpower the leakage of the PMOS cascode devices. In such an embodiment, overstress of Vgs in the cross-coupled PMOS pair is avoided. In such an embodiment, the transistors MP3 and MP4 speed up the rise transitions for signals on nodes X3 and X3b. In one embodiment, transistors MP3 and MP4 are eliminated from the design.

In one embodiment, the cascode stage 102b couples the output (X0 and X0b) of the first stage 101 to the output X3 and X3*b* of the level-shifting stage 102. In one embodiment, the cascode stage 102*b* comprises two stacks of transistors coupled in series with one another such that one stack of transistors couples to the drain of MP1 and the other stack of transistors couples to the drain of MP2.

In one embodiment, the first stack in the cascode stage 102*b* comprises a fifth p-type MOS transistor MP5 coupled in series with a first n-type MOS transistor MN1 which couples to a second n-type MOS transistor MN2 as shown in FIG. 2B. In one embodiment, the second stack in the cascode stage 102*b* comprises a sixth p-type MOS transistor MP6 coupled in series with a third n-type MOS transistor MN3 which couples to a fourth n-type MOS transistor MN4 as shown in FIG. 2B. In this embodiment, the source terminals of the MN2 and MN4 couple to the output (X0 and X0*b*) of the input stage 101. In one embodiment, the gate terminals of MP5 and MP6 are coupled to the third power supply 130. In one embodiment, the gate terminals of MN1 and MN3 are coupled to the fourth power supply 140. In one embodiment, the gate terminals of MN2 and MN4 are coupled to first power supply 110.

In one embodiment, the level-shifting stage 102 includes capacitors C1 and C2. In one embodiment, C1 is coupled between the ends of the first stack in the cascode stage 102*b* while C2 is coupled between the ends of the second stack in the cascode stage 102*b*. In one embodiment, C1 couples between the source terminal of MN2 and the drain terminal of MP1. In one embodiment, C1 couples between source terminal of MN4 and the drain terminal of MP2. In one embodiment, capacitors C1 and C2 may be sized so that their capacitances are approximately equal. For example, capacitors C1 and C2 may range from approximately twenty femtoFarads (fF) to approximately hundred femtoFarads (fF). In some embodiments, C1 and C2 may be sized to be larger than the parasitic capacitance between the drain of transistors MP1 and MP2 and a ground connection. In one embodiment, the capacitors C1 and C2 may enable the level-shifting stage 102 to perform quick level shifting operations and also eliminate potential contention problems associated with transistors MP1 and MP2. In one embodiment, the capacitors C1 and C2 may enable the outputs OUT and OUTb to transition faster, when the input signals X0 and X0*b* transition, by limiting the contention current flow associated with transistors MP1 and MP2.

As mentioned herein, in one embodiment the input stage 200/101 helps eliminate the contention between MP1 and MP2 of the level-shifting stage 102. By eliminating the contention, the overall propagation delay and power dissipation of the HVLS 100 are reduced.

Figure 2C:
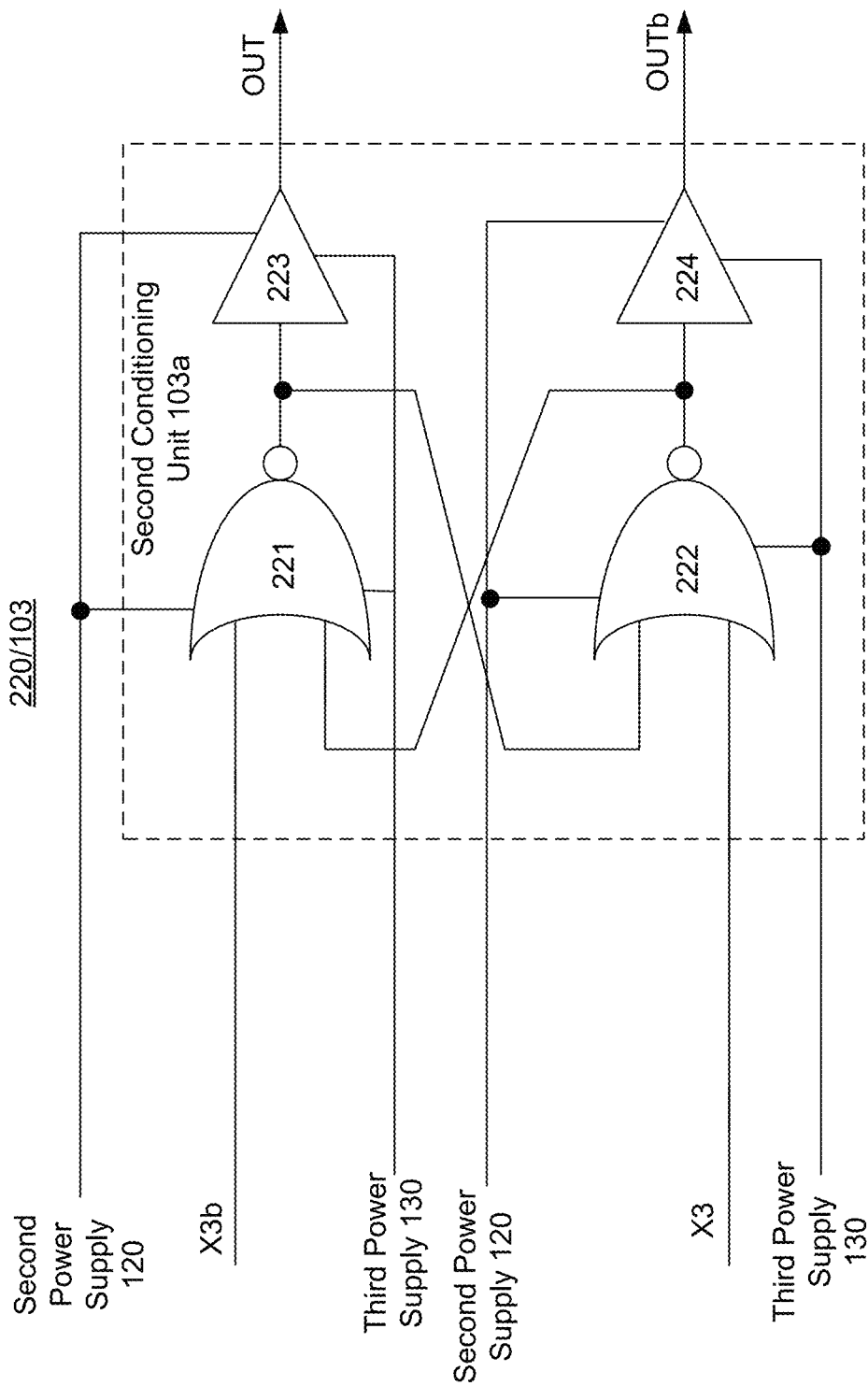
FIG. 2C is a schematic view of the output stage of the high-voltage level-shifter, according to one embodiment of the invention.

FIG. 2C is a schematic view of the output stage 220/103 of the HVLS 100, according to one embodiment of the invention. In one embodiment, the second signal conditioning unit 103*a* comprises an RS latch including a pair of cross-coupled NOR logic gates 221 and 222 and buffer stages 223 and 224. In one embodiment the RS latch improves differential-to-single-ended conversion of the signals. In other embodiments, other signal conditioning units may be used without changing the scope of the embodiment of the invention. The cross-coupled NOR logic gates 221 and 222 receive the outputs X3 and X3*b* of the level-shifting stage 101. In one embodiment, the output of NOR gate 221 is input to NOR gate 222 and output of NOR gate 222 is input to NOR gate 221. In one embodiment, the second signal conditioning unit 103*a* generates a differential output signal OUT and OUTb which operate on the second power supply 120. The output signals OUT and OUTb have rail-to-rail voltage swings that correspond to the second power supply 120 and the third power supply 130. In the embodiments discussed herein the third power supply 130 is smaller than the second power supply 120.

In one embodiment, when the input signal IN to the input stage 101 is logic-HIGH, i.e. IN=1, the outputs X0 and X0*b* of the input stage 101 are logically high and low respectively. The logical high and low levels of X0 and X0*b* pulls the voltage level on the drain terminals of MP1, i.e. X3, to the second power supply 120. In one embodiment, the output stage 103 stores/consolidates/conditions the voltage levels of X3 and X3*b* and provides the level-shifted complementary outputs OUT and OUTb. The nodes X2 and X2*b* swing between the second power supply 120 and ground. In the embodiments discussed herein, none of the transistors' Vgs or Vds exceeds the stress voltage limit of the transistors at any given time. In one embodiment, the drain-to-body voltage of some devices may reach the second power supply 120.

In one embodiment, MP3 and MP4 are always off, i.e. leaking PMOS devices, to help prevent the voltage levels on nodes X3 and X3*b* from falling below certain levels during operation. In such an embodiment, MP2 and MP4 prevent Vgs and Vds levels of MP1 and MP2 from exceeding the stress voltage limits for those transistors and improve overall reliability of the HVLS 100.

FIG. 3 is a table 300 showing various operating modes of the HVLS 100, according to one embodiment of the invention. As discussed in the embodiments herein, the first, second, third, and fourth power supplies (110, 120, 130, and 140) are decoupled from one another. The decoupled power supplies allow the HVLS 100 to operate in at least two different modes indicated by the left most column of table 300.

The first operation mode (second row of the table 300) is the High Voltage Application mode that allows the HVLS 100 to level-shift both logical high and logical low levels of the input signal IN. In one embodiment, the HVLS 100 can operate in the first operation mode by setting the first power supply 110 to be the logical high level of the input signal IN, the second power supply 120 to be the logical high level of the output signals OUT and OUTB, the third power supply 130 to be the logical low level of the output signals OUT and OUTB, and the fourth power supply 140 to be set at a power supply level which is lower than the second power supply 120. For example, the fourth power supply 140 is set at one half the second power supply 120.

The second operational mode (third row of the table 300) is the Low Voltage Application mode that allows the HVLS 100 to operate as a normal level-shifter that level-shifts a logical high level of the input signal IN to another logical high level for the output signals OUT and OUTb. In one embodiment, the HVLS 100 can operate in the second operational mode by setting the first power supply 110 to be the logical high level of the input signal IN, the second power supply 120 to be the logical high level of the output signals OUT and OUTB, the third power supply 130 to be tied to ground representing the logical low level of the output signals OUT and OUTb, and the fourth power supply 140 to be set at a power supply level which is the same as the second power supply 120.

Figure 4:
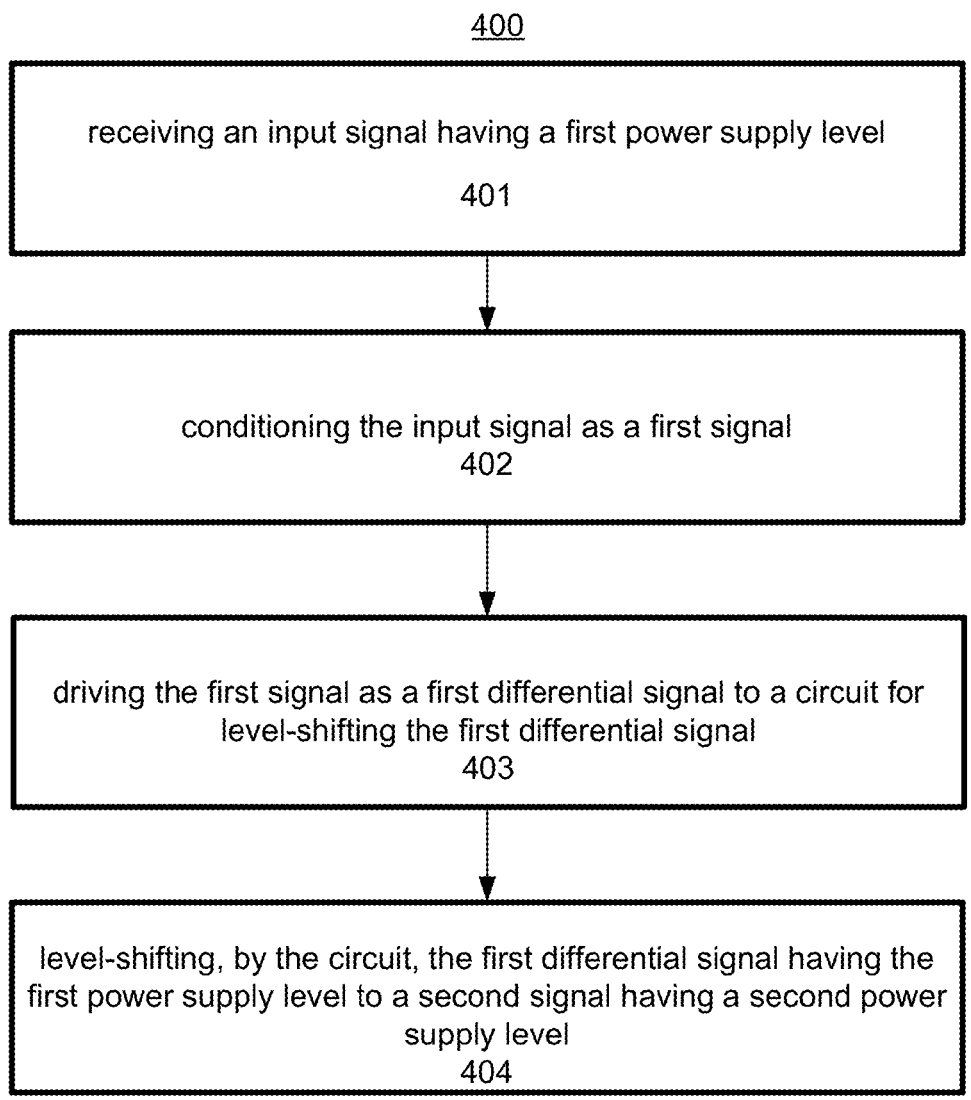
FIG. 4 is a method flowchart for level-shifting a digital signal from one power supply to two or more power supplies via the high-voltage level-shifter, according to one embodiment of the invention.

FIG. 4 is a method flowchart 400 for level-shifting a digital signal from one power supply to two or more power supplies via the HVLS 100, according to one embodiment of the invention. Although the blocks in the flowchart 400 are shown in a particular order, the order of the actions can be modified. Thus, the illustrated embodiments can be performed in a different order, and some actions/blocks may be performed in parallel. Additionally, one or more actions/blocks can be omitted in various embodiments of level-shifting an input signal from one power supply level to another power supply level using the HVLS 100. The flowchart of FIG. 4 is illustrated with reference to the embodiments of FIGS. 1-3.

At block 401, the input stage 101 receives the input signal IN operating on the first power supply 110. As discussed herein, a signal operating on a power supply refers to the logical high or low level of that signal. In this example, the input signal IN has a logical high level which corresponds to the first power supply 110. At block 402, the input stage 101 stores the input signal IN as a first signal. In such an embodiment, the input signal IN is stored by the signal conditioning unit 101a which operates on the first power supply 110. At block 403, the input stage 101 drives the first signal as a first differential signal (X0 and X0b) to the level-shifting stage 102 for level-shifting the first differential signal (X0 and X0b).

At block 404, the level-shifting stage 102 level-shifts the first differential signal (X0 and X0b) operating on the first power supply 110 to a second signal (X3 and X3b) operating or having the second power supply 120, wherein the second power supply level 120 is higher than the first power supply level 110.

The method further comprises: receiving by the output stage 103 the second signal as a second differential signal (X3 and X3b); storing the second differential signal (X3 and X3b) as a third signal by the second signal conditioning unit 103a; and driving the third signal by the buffers of the output stage 102 as a third differential signal (OUT and OUTb) operating or having the second power supply level 120.

In one embodiment, the method of level-shifting the first differential signal (X0 and X0b) by the level-shifting stage 102 from the first power supply 110 to the second power supply 120 comprises: coupling first and second P-transistors MP1 and MP2 with corresponding source terminals to a node having the second power supply level 120; coupling, in parallel, third and fourth P-transistors MP3 and MP4 to MP1 and MP2, respectively; and coupling corresponding gate terminals of MP3 and MP4 to the node having the second power supply level 120. In one embodiment, the method further comprises outputting the second signal via the drain terminals of MP1 and MP2; coupling in series a fifth P-transistor MP5 with MP1; coupling in series a first N-transistor MN1 with MP5; and coupling in series a second N-transistor MN2 with MN1.

In one embodiment, the method of level-shifting the first differential signal (X0 and X0b) by the level-shifting stage 102 from the first power supply 110 to the second power supply 120 further comprises: coupling a gate terminal of MP5 to a node having the third power supply level 130; coupling a gate terminal of MN1 to a node having the fourth power supply level 140; and coupling a gate terminal of MN2 to a node having the first power supply level 110. In one embodiment, the method further comprises receiving, at a source terminal of the MN2, one of the first differential signals (X0 and X0b); and coupling a first capacitor C1 between a source terminal of MN2 and the drain terminal of MP1. In one embodiment, the method further comprises receiving, at a source terminal of the MN4, one of the first differential signals (X0 and X0b); and coupling a second capacitor C2 between a source terminal of MN4 and the drain terminal of MP2.

In one embodiment, the method further comprises enabling a first operational mode (second row of table 300), also called the High Voltage Application mode, including: assigning a voltage level that exceeds P-transistor reliability voltage limit as the second power supply level 120; and assigning half of the second voltage supply level 120 as fourth and third voltage supply levels 140 and 130 respectively.

In one embodiment, the method further comprises enabling a second operational mode (third row of table 300), also called the Low Voltage Application mode, including: assigning a voltage level that exceeds P-transistor reliability voltage limit as the second power supply level 120; assigning the second voltage supply level 120 as the fourth voltage supply level 140; and assigning a ground supply level as the third voltage supply level 130.

Figure 5:
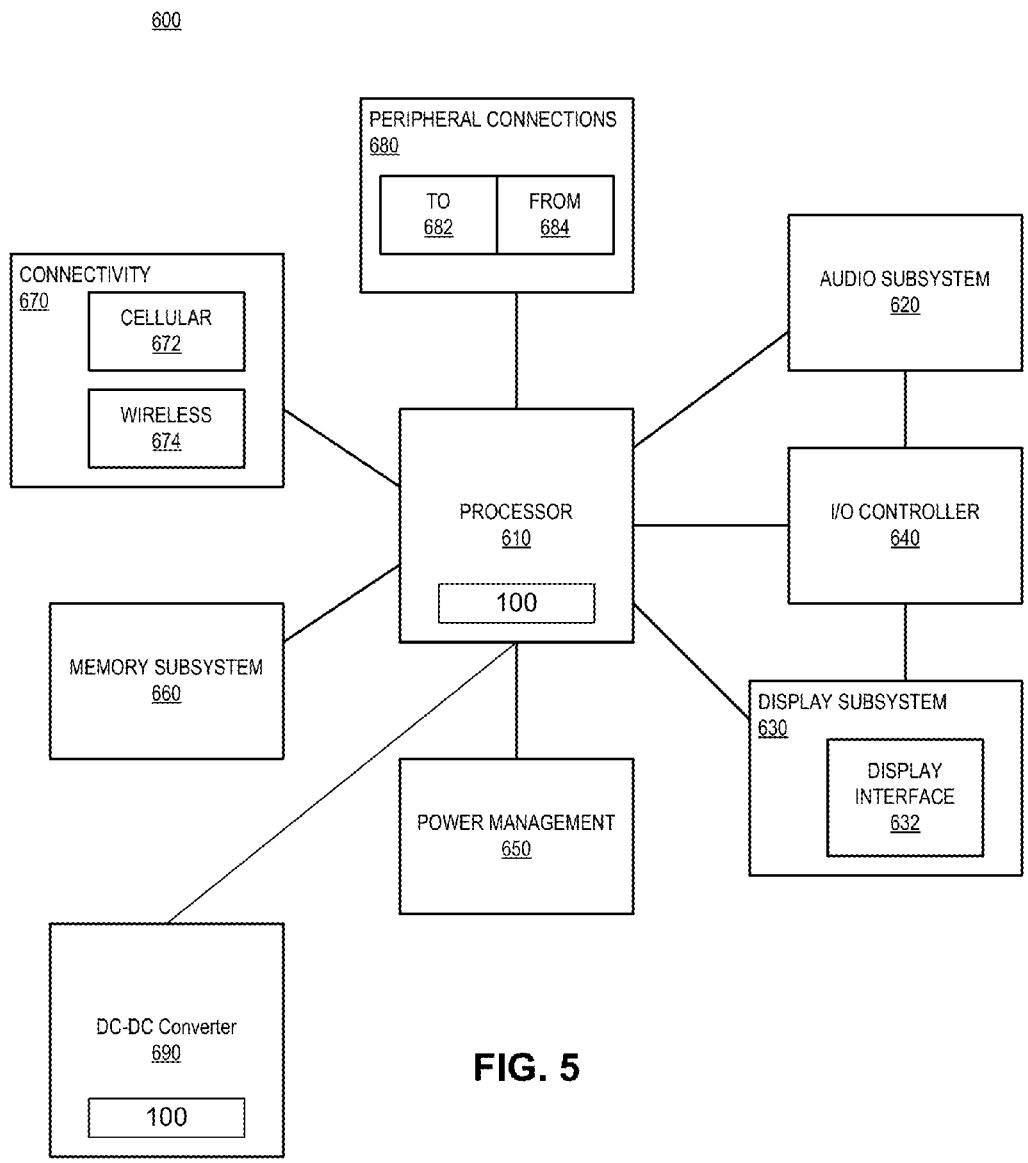
FIG. 5 is a system-level diagram of a smart device comprising a processor and a DC-DC converter having the high-voltage level-shifter, according to one embodiment of the invention.

FIG. 5 is a system-level diagram 600 of a smart device comprising a processor and a DC-DC converter having the HVLS 100, according to one embodiment of the invention. FIG. 5 also illustrates a block diagram of an embodiment of a mobile device in which flat surface interface connectors could be used. Computing device 600 represents a mobile computing device, such as a computing tablet, a mobile phone or smart-phone, a wireless-enabled e-reader, or other wireless mobile device. It will be understood that certain of the components are shown generally, and not all components of such a device are shown in device 600.

Device 600 includes processor 610 and DC-DC converter 690. In one embodiment, the processor 610 and/or the DC-DC converter 690 include the HVLS 100 as discussed with reference to FIGS. 1-4. In one embodiment, the DC-DC converter 690 is operable to convert or shift an input DC voltage to an output DC voltage by means of the HVLS 100. In other system embodiments of the present invention, more than one component may comprise the HVLS 100. For example, system 600 may comprise a flash memory in 660, and the flash memory may have the HVLS 100 to receive data signals and shift the data signals so that the flash memory can receive and transmit data in the correct data voltage range or ranges. In an alternative embodiment, a data bus of the system 600 may be equipped with at least one HVLS 100 according to the various embodiments of the present invention ensuring that it transmits and receives data in the correct data voltage range or ranges. Still yet other embodiments of the present invention may be utilized in on- or off-die DC-DC converters, for example the DC-DC converter 690, or high voltage drivers in non-volatile (Flash) memory programming circuits. The various embodiments of the present invention may also comprise a network interface within 670 such as a wireless interface so that a system embodiment may be incorporated into a wireless device such as cell phone or personal digital assistant.

Referring back to FIG. 5, the processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, the I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 includes memory devices for storing information in device 600. Memory can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

Elements of embodiments are also provided as a machine-readable medium (e.g., memory 660) for storing the computer-executable instructions (e.g., instructions to implement the flowchart of FIG. 4 and any other processes discussed herein). The machine-readable medium (e.g., memory 660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audio-visual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
an input driver comprising a first signal conditioning unit operating on a first power supply level, the first signal conditioning unit comprising a first logic gate and a second logic gate to input an input signal and to generate a first differential signal and a second differential signal based on the input signal, wherein an output of the first logic gate is input to the second logic gate and is used to generate the first differential signal, and wherein an output of the second logic gate is input to the first logic gate and is used to generate the second differential signal;
a circuit to receive the first differential signal and the second differential signal and to provide a second signal based at least in part on the first differential signal and the second differential signal, the second signal being level-shifted from the first power supply level to a second power supply level; and
an output driver including a second signal conditioning unit, the output driver to receive the second signal and for conditioning the second signal as a third signal, the output driver operating on the second power supply level and for driving out the third signal.

2. The apparatus of claim 1, wherein the first and second signal conditioning units include set-reset (SR) flip-flops.

3. The apparatus of claim 1, wherein the circuit comprises:
a cascode stage; and
a cross-coupled stage coupled to the cascode stage.

4. The apparatus of claim 3, wherein the cross-coupled stage comprises:
first and second P-transistors with corresponding source terminals coupled to a node having the second power supply level.

5. The apparatus of claim 4, wherein the cross-coupled stage comprises:
third and fourth P-transistors coupled in parallel to the first and second P-transistors respectively, wherein the third and fourth P-transistors with corresponding gate terminals coupled to the node having the second power supply level.

6. The apparatus of claim 4, wherein the drain terminals of the first and second P-transistors for providing the second signal.

7. The apparatus of claim 4, wherein a gate terminal of the first P-transistor is coupled to the drain terminal of the second P-transistor.

8. The apparatus of claim 4, wherein a gate terminal of the second P-transistor is coupled to the drain terminal of the first P-transistor.

9. The apparatus of claim 4, wherein:
a gate terminal of the first N-transistor is coupled to a node having a fourth power supply level;
a gate terminal of the second N-transistor is coupled to a node having the first power supply level; and
a source terminal of the second N-transistor to receive the first signal.

10. The apparatus of claim 4 further comprises a first capacitor coupled between a source terminal of the second N-transistor and the terminal of the first P-transistor.

11. The apparatus of claim 9, wherein the nodes having the first power supply level and third and fourth power supply levels are separate nodes.

12. The apparatus of claim 1 wherein the circuit is operable to provide the second signal as a differential output signal.

13. A method comprising:
receiving an input signal having a first power supply level;
generating a first differential signal and a second differential signal based on the input signal using a first signal conditioning unit comprising a first logic gate and a second logic gate, wherein an output of the first logic gate is input to the second logic gate and is used to generate the first differential signal, and wherein an output of the second logic gate is input to the first logic gate and is used to generate the second differential signal;
driving the first differential signal and the second differential signal to a circuit for level-shifting;
level-shifting, by the circuit, the first differential signal and the second differential signal having the first power supply level to a second signal having a second power supply level;
receiving the second signal as a third differential signal;
conditioning the third differential signal as a third signal; and
driving the third signal as a fourth differential signal having the second power supply level.

14. A system comprising:
a wireless connectivity;
a processor, communicatively coupled to the wireless connectivity, the processor comprising a level-shifter, the level-shifter including:
an input driver comprising a first signal conditioning unit operating on a first power supply level, the first signal conditioning unit comprising a first logic gate and a second logic gate to input an input signal and to generate a first differential signal and a second differential signal based on the input signal, wherein an output of the first logic gate is input to the second logic gate and is used to generate the first differential signal, and wherein an output of the second logic gate is input to the first logic gate and is used to generate the second differential signal;
a circuit to receive the first differential signal and the second differential signal and to provide a second signal based at least in part on the first differential signal and the second differential signal, the second signal being level-shifted from the first power supply level to a second power supply level;
a display unit for displaying content processed by the processor; and
an output driver including a second signal conditioning unit, the output driver to receive the second signal and for conditioning the second signal as a third signal, the output driver operating on the second power supply level and for driving out the third signal.

15. The system of claim 14, wherein the first and second signal conditioning units include set-reset (SR) flip-flops.

16. The system of claim 14, wherein the circuit comprises:
a cascode stage; and
a cross-coupled stage coupled to the cascode stage.

17. The system of claim 16, wherein the cross-coupled stage comprises:
first and second P-transistors with corresponding source terminals coupled to a node having the second power supply level; and
third and fourth P-transistors coupled in parallel to the first and second P-transistors respectively, wherein the third and fourth P-transistors with corresponding gate terminals coupled to the node having the second power supply level.

18. The system of claim 17, wherein:
the drain terminals of the first and second P-transistors for providing the second signal,
a gate terminal of the first P-transistor is coupled to the drain terminal of the second P-transistor, and
a gate terminal of the second P-transistor is coupled to the drain terminal of the first P-transistor.

19. The system of claim 14, wherein the output stage is operable to provide the output signal as a differential output signal.

20. The system of claim 14, wherein the level-shifter is positioned in a DC-DC converter of a power supply unit, and wherein the display unit is a touch screen.

21. The system of claim 14, wherein the processor includes high voltage drivers.

\* \* \* \* \*